United States Patent
Kang et al.

[11] Patent Number: 6,055,175
[45] Date of Patent: Apr. 25, 2000

[54] NONVOLATILE FERROELECTRIC MEMORY

[75] Inventors: Hee Bok Kang, Taejeon-si; Doo Young Yang, Chungcheongbuk-do, both of Rep. of Korea

[73] Assignee: LG Semicon Co., Ltd., Cheongju, Rep. of Korea

[21] Appl. No.: 09/157,947

[22] Filed: Sep. 22, 1998

[30] Foreign Application Priority Data

Jun. 30, 1998 [KR] Rep. of Korea ................ 98/25917

[51] Int. Cl.⁷ ...................................... G11C 11/22
[52] U.S. Cl. ...................... 365/145; 365/148; 365/149; 365/210
[58] Field of Search .................... 365/145, 210, 365/149, 148; 257/295

[56] References Cited

U.S. PATENT DOCUMENTS

| | | | |
|---|---|---|---|
| 4,433,390 | 2/1984 | Carp et al. | 364/900 |
| 4,873,664 | 10/1989 | Eaton, Jr. | 365/145 |
| 4,888,630 | 12/1989 | Paterson | 357/23.5 |
| 4,928,095 | 5/1990 | Kawahara | 340/784 |
| 5,010,518 | 4/1991 | Toda | 365/145 |
| 5,189,594 | 2/1993 | Hoshiba | 257/295 |
| 5,371,699 | 12/1994 | Larson | 365/145 |
| 5,628,318 | 5/1997 | Seyyedy | 365/145 |
| 5,680,344 | 10/1997 | Seyyedy | 365/145 |
| 5,804,850 | 9/1998 | Evans, Jr. et al. | 257/295 |
| 5,898,609 | 4/1999 | Yoo | 365/148 X |

*Primary Examiner*—Huan Hoang
*Attorney, Agent, or Firm*—Fleshner & Kim, LLP

[57] ABSTRACT

A nonvolatile memory has a cell structure of one transistor/one capacitor/one resistor (1T/1C/1R). Such a structure allows high speed access operation and efficiently prevent a reference cell from being degraded. The nonvolatile memory includes a first memory cell array having a plurality of first word lines formed in a first direction, a plurality of bit lines in a second direction, a first common signal line formed in one of first and second directions, and a plurality of first memory cells. Each first memory cell is coupled to a corresponding first word line, a corresponding bit line, and the first common signal line. A controller is coupled to the plurality of bit lines, and the controller allows at least one of reading of data stored in a corresponding first memory cell and writing of data to a corresponding first memory cell. Each first memory cell of the first memory cell array includes a first transistor having first and second electrodes and a control electrode, where the control electrode is coupled to the corresponding first word line and the first electrode is coupled to the corresponding bit line. A first capacitor is coupled to the second electrode of the first transistor and the first common signal line. A first resistor is coupled in parallel with the first capacitor.

34 Claims, 12 Drawing Sheets

43a
43b

51

NONVOLATILE FERROELECTRIC MEMORY

BACKGROUND OF THE INVENTION

1. Field of the Invention

The present invention relates to a semiconductor memory device, and more particularly, to a nonvolatile ferroelectric memory in which one cell has a structure of 1T/1C/1R to enable high speed access operation and efficiently prevent a reference cell from being degraded.

2. Discussion of the Related Art

A background art nonvolatile ferroelectric memory will be described with reference to the accompanying drawings.

FIG. 1 is a hysteresis loop of a typical ferroelectric. FIG. 2 is a circuit diagram illustrating a background art ferroelectric memory.

Generally, a ferroelectric memory, that is, ferroelectric random access memory (FRAM) has received much attention for use in a next generation memory device. The ferroelectric memory has processing speed as much as DRAM (dynamic random access memory) used in a semiconductor memory device, and retains data even in the event of power-off. The FRAM which has the almost same structure as the DRAM is a memory device in which data are not erasable even if electric field is removed using high residual polarization characteristic of a ferroelectric used as a material of a capacitor.

In other words, as shown in hysteresis loop of FIG. 1, the polarization organized by the electric field is maintained at a constant amount (d, a state) without extinction due to spontaneous polarization even if the electric field is removed. For application of a memory device, d, a correspond to 1, 0, respectively.

The background art nonvolatile ferroelectric memory device, in general, includes a main memory cell block 1 and a reference cell block 2. The background art nonvolatile ferroelectric memory device includes a sensing amplifier/bitline control block 3 for reading out data of the main memory cell block 1 using the reference cell block 2.

The aforementioned background art nonvolatile ferroelectric memory device will be described in detail.

The main memory cell block 1 includes first and second wordlines WL1 and WL2, a first cell transistor MN1 whose gate is connected to the first wordline WL1 and one electrode is connected to a bitline Bit_line, a second transistor MN2 whose gate is connected to the second wordline WL2 and one electrode is connected to a bit bar line BitB_line, a first ferroelectric capacitor FC1 whose first electrode is connected to the other electrode of the first transistor MN1 and second electrode is connected to a cell plate line CPL, and a second ferroelectric capacitor FC2 whose first electrode is connected to the other electrode of the second transistor MN2 and second electrode is connected to the cell plate line CPL.

The reference cell block 2 includes first and second wordlines WL1 and WL2, a reference transistor RN1 whose gate is connected to the second wordline WL2 and one electrode is connected to the bitline Bit_line, a second reference transistor RN2 whose gate is connected to the first wordline WL1 and one electrode is connected to the bit bar line BitB_line, a first reference ferroelectric capacitor RFC1 whose first electrode is connected to the other electrode of the first reference transistor RN1 and second electrode is connected to a plate line PL, and a second reference ferroelectric capacitor RFC2 whose first electrode is connected to the other electrode of the second reference transistor RN2 and second electrode is connected to the plate line PL.

The sensing amplifier/bitline control block 3 includes a bitline control block and a sensing amplifier block. The bitline control block includes first and second NMOS transistors N1 and N2 whose gates are in common connected to a bitline control signal input terminal PBL, one electrodes are connected to the bitline and the bit bar line, respectively, and the other electrodes are connected to a ground terminal Vss, and third, fourth and fifth NMOS transistors N3, N4 and N5 whose gates are in common connected to a bit bar line control signal input terminal EBL. The sensing amplifier block includes first and second PMOS transistors P1 and P2 whose one electrodes are in common connected to a sensing amplifier PMOS enable signal input terminal SAP, and sixth and seventh NMOS transistors N6 and N7 whose one electrodes are in common connected to a sensing amplifier NMOS enable signal input terminal SAN.

Source and drain of the fifth NMOS transistor N5 are connected to the bitline and the bit bar line, respectively.

One electrodes of the third and fourth transistors N3 and N4 are in common connected to a precharge signal input terminal Vcc/2 and the other electrodes thereof are connected to the bitline and the bit bar line, respectively.

Gates of the first PMOS transistor P1 and the sixth NMOS transistor N6 and the other electrodes of the second PMOS transistor P2 and the seventh NMOS transistor N7 are in common connected to the bit bar line.

Gates of the second PMOS transistor P2 and the seventh NMOS transistor N7 and the other electrodes of the first PMOS transistor P1 and the sixth NMOS transistor N6 are in common connected to the bit line.

Data sensing operation of the background art nonvolatile ferroelectric memory device will be described below.

If a low signal is applied through the bitline control signal input terminal PBL, the bitline and the bit bar line are separated from the ground voltage Vss.

If a wordline driving signal W/L is applied at high level, a data signal output from the first ferroelectric capacitor FC1 is transmitted to the bitline Bit_line. At this time, a data signal output from the second reference ferroelectric capacitor RFC2 of the reference cell is transmitted to the bit bar line BitB_line.

The sensing amplifier block amplifies voltage difference between the bit line and the bit bar line. The bitline and the bit bar line are equalized by Vcc/2, so that a voltage at both ends of the first and second ferroelectric capacitors FC1 and FC2 becomes 0V. Further, the wordline becomes Vss level, and the bitline and bit bar line become Vss level if a high signal is applied through the bitline control signal input terminal PBL.

The background art nonvolatile ferroelectric memory device has several problems.

At a standby mode, a node cn1 and a node cn2 become floating state. Therefore, a memory voltage of the nodes cn1 and cn2 drops to 0V due to junction leakage or PL1 voltage is maintained at Vcc/2. This applies inverse bias to the ferroelectric capacitor, thereby resulting in that stored data are lost. To avoid such data loss, there must be provided a circuit for compensating a voltage of a node within the memory cell and a compensating cycle.

SUMMARY OF THE INVENTION

Accordingly, the present invention is directed to a nonvolatile ferroelectric memory that substantially obviates one or more of the problems due to limitations and disadvantages of the related art.

An object of the present invention is to provide a nonvolatile ferroelectric memory in which one cell has a structure of 1T/1C/1R to enable high speed access operation and efficiently prevent a reference cell from being degraded.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a nonvolatile ferroelectric memory according to the present invention includes: main memory cell blocks including first and second wordlines WL1 and WL2, a first cell transistor MN1 whose gate is connected to the first wordline WL1 and one electrode is connected to a bitline Bit_line, a second transistor MN2 whose gate is connected to the second wordline WL2 and one electrode is connected to a bit bar line BitB_line, a first ferroelectric capacitor FC1 whose first electrode is connected to the other electrode of the first transistor MN1 and second electrode is connected to a Vcc/2 voltage applying line hvcc, a first resistor device RM1 formed between a first node n1 for connecting the other electrode of the first transistor MN1 with the first electrode of the first ferroelectric capacitor FC1 and the Vcc/2 voltage applying line hvcc, a second ferroelectric capacitor FC2 whose first electrode is connected to the other electrode of the second transistor MN2 and second electrode is connected to the Vcc/2 voltage applying line hvcc, and a second resistor device RM2 formed between a second node n2 for connecting the other electrode of the second transistor MN2 with the first electrode of the second ferroelectric capacitor FC2 and the Vcc/2 voltage applying line hvcc; and reference cell blocks formed to correspond to the main memory cell blocks, for reading out data of the memory cell blocks.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

A nonvolatile ferroelectric memory according to the present invention is intended that resistor devices are in parallel formed at both ends of a capacitor, so that there are no additionally required a circuit for compensating a voltage of a node within a memory cell and a separate compensating cycle.

The nonvolatile ferroelectric memory according to the present invention in general includes a memory cell block 31 and a reference block 32. The nonvolatile ferroelectric memory includes a sensing amplifier/bitline control block 33 for reading out data of the memory cell block 31 using the reference cell block 32.

The nonvolatile ferroelectric memory according to the present invention will be described in detail.

Figure 1:
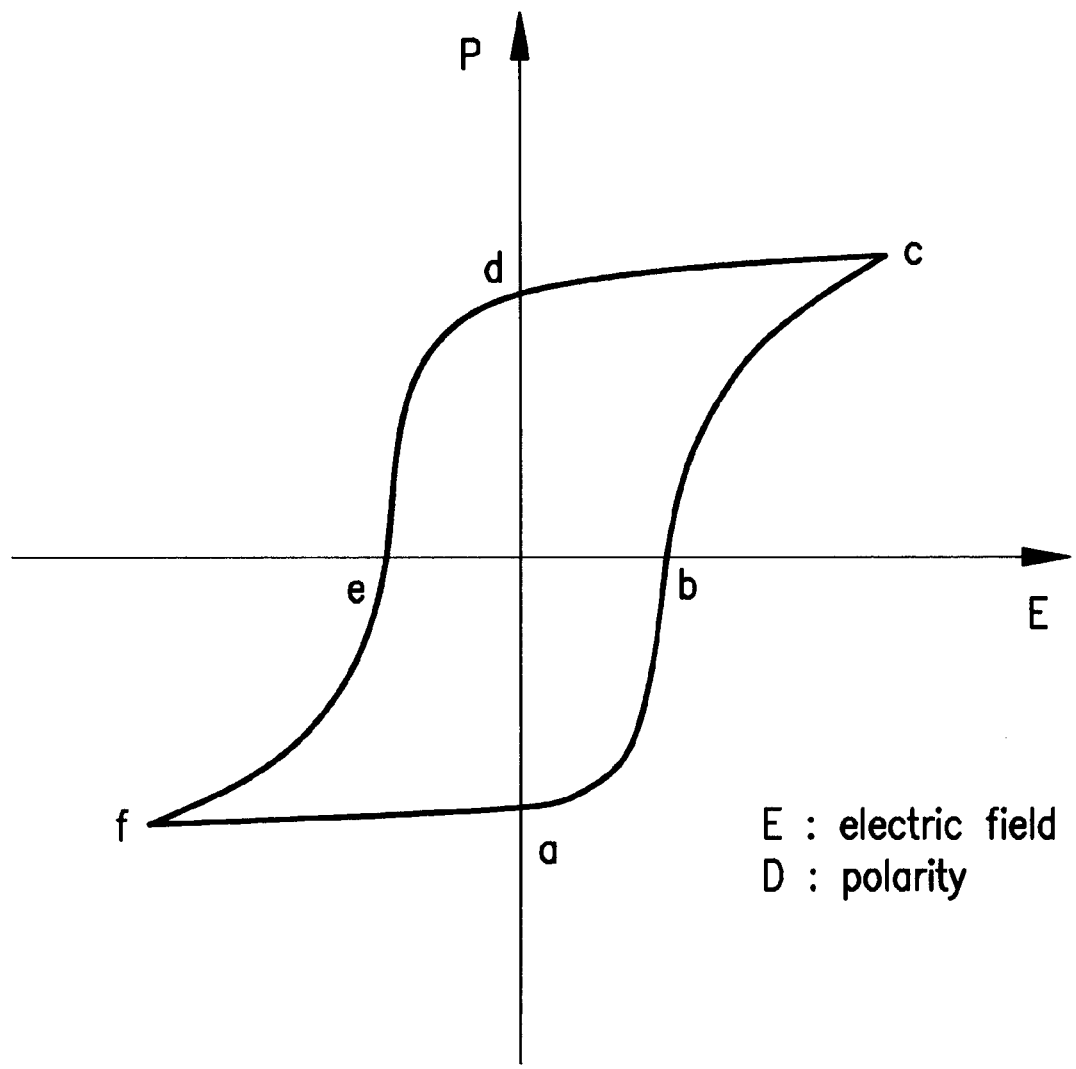
FIG. 1 is a hysteresis loop of a typical ferroelectric.
Figure 2:
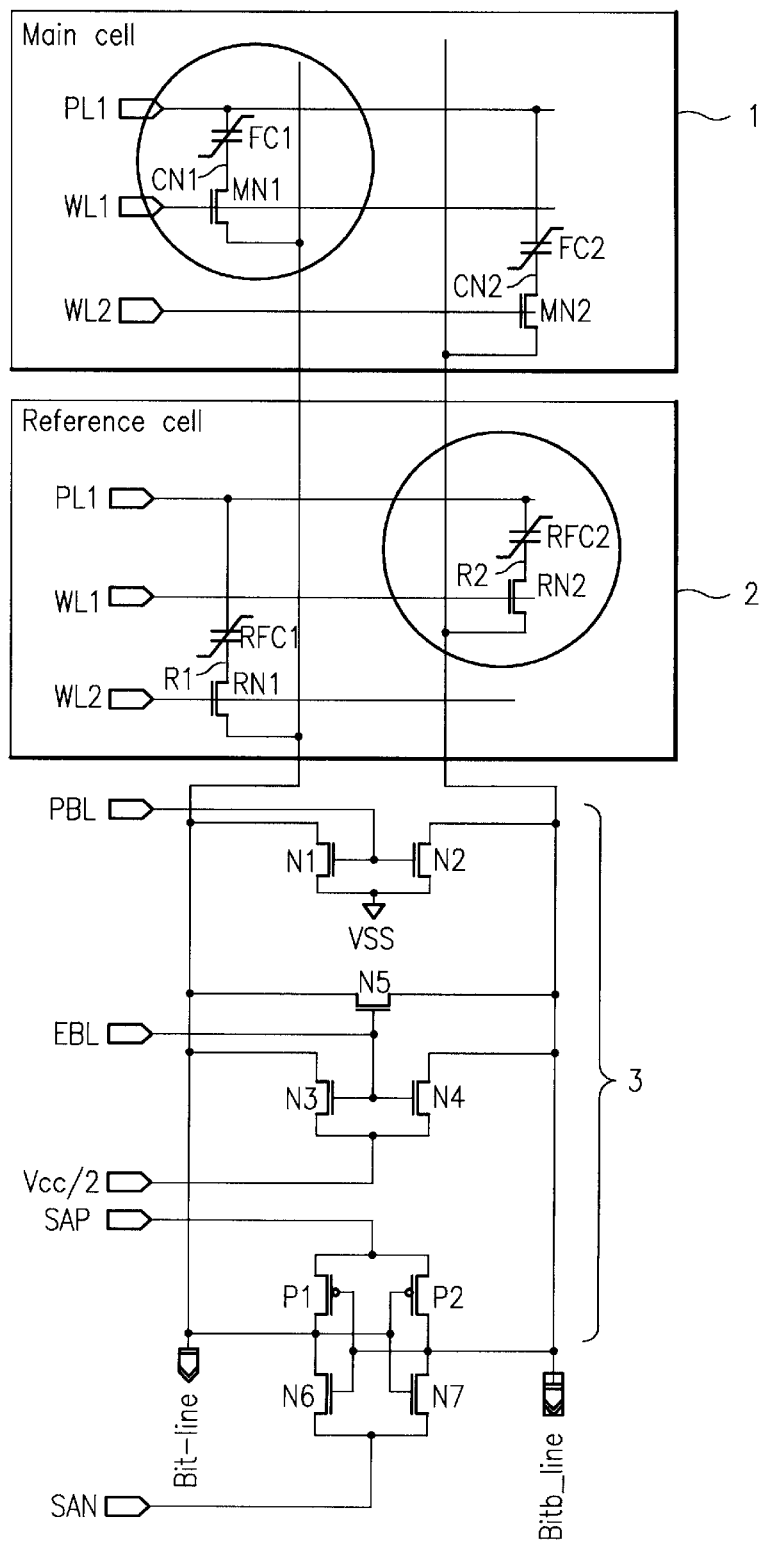
FIG. 2 is a circuit diagram illustrating a background art ferroelectric memory.
Figure 3:
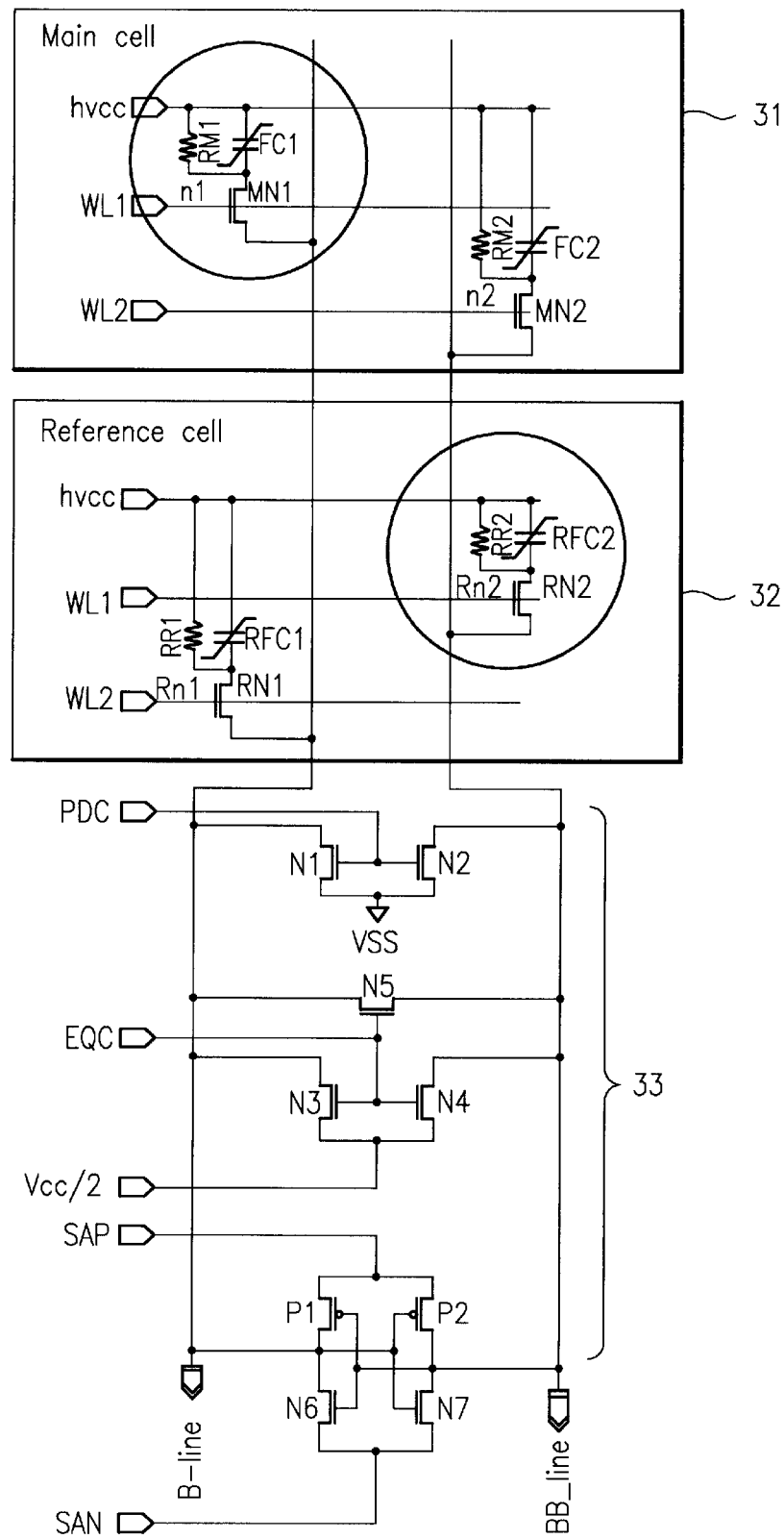
FIG. 3 is a circuit diagram illustrating a ferroelectric memory according to the present invention.

As shown in FIG. 3, the main memory cell block 31 includes first and second wordlines WL1 and WL2, a first cell transistor MN1 whose gate is connected to the first wordline WL1 and one electrode is connected to a bitline Bit_line, a second transistor MN2 whose gate is connected to the second wordline WL2 and one electrode is connected to a bit bar line BitB_line, a first ferroelectric capacitor FC1 whose first electrode is connected to the other electrode of the first transistor MN1 and second electrode is connected to a Vcc/2 voltage applying line hvcc, a first resistor device RM1 formed between a first node n1 for connecting the other electrode of the first transistor MN1 with the first electrode of the first ferroelectric capacitor FC1 and the Vcc/2 voltage applying line hvcc, a second ferroelectric capacitor FC2 whose first electrode is connected to the other electrode of the second transistor MN2 and second electrode is connected to the Vcc/2 voltage applying line hvcc, and a second resistor device RM2 formed between a second node n2 for connecting the other electrode of the second transistor MN2 with the first electrode of the second ferroelectric capacitor FC2 and the Vcc/2 voltage applying line hvcc.

The reference cell block 32 includes first and second wordlines WL1 and WL2, a first reference transistor RN1 whose gate is connected to the second wordline WL2 and one electrode is connected to the bitline Bit_line, a first reference ferroelectric capacitor RFC1 whose first electrode is connected to the other electrode of the first reference transistor RN1 and second electrode is connected to the Vcc/2 voltage applying line hvcc, a first resistor device RR1 formed between a first node Rn1 for connecting the other electrode of the first reference transistor RN1 with the first electrode of the first reference ferroelectric capacitor RFC1 and the Vcc/2 voltage applying line hvcc, a second reference transistor RN2 whose gate is connected to the second wordline WL2 and one electrode is connected to the bit bar line BitB_line, a second reference ferroelectric capacitor RFC2 whose first electrode is connected to the other electrode of the second reference transistor RN2 and second electrode is connected to the Vcc/2 voltage applying line hvcc, and a second resistor device RR2 formed between a second node Rn2 for connecting the other electrode of the second reference transistor RN2 with the first electrode of the first reference ferroelectric capacitor RFC1 and the Vcc/2 voltage applying line hvcc.

The sensing amplifier/bitline control block 33 includes a bitline control block and a sensing amplifier block. The bitline control block includes first and second NMOS transistors N1 and N2 whose gates are in common connected to a pull-down control signal input terminal PDC, one electrodes are connected to the bitline and the bit bar line, respectively, and the other electrodes are connected to a ground terminal Vss, and third, fourth and fifth NMOS transistors N3, N4 and N5 whose gates are in common connected to a pull-up control signal input terminal EQC. The sensing amplifier block includes first and second PMOS transistors P1 and P2 whose one electrodes are in common connected to a sensing amplifier PMOS enable signal input terminal SAP, and sixth and seventh NMOS transistors N6 and N7 whose one electrodes are in common connected to a sensing amplifier NMOS enable signal input terminal SAN.

Source and drain of the fifth NMOS transistor N5 are connected to the bitline and the bit bar line, respectively.

One electrodes of the third and fourth transistors N3 and N4 are in common connected to a precharge signal input terminal Vcc/2 and the other electrodes thereof are connected to the bitline and the bit bar line, respectively.

Gates of the first PMOS transistor P1 and the sixth NMOS transistor N6 and the other electrodes of the second PMOS transistor P2 and the seventh NMOS transistor N7 are in common connected to the bit bar line.

Gates of the second PMOS transistor P2 and the seventh NMOS transistor N7 and the other electrodes of the first PMOS transistor P1 and the sixth NMOS transistor N6 are in common connected to the bit line.

The section structure and the process steps for the unit cell of the nonvolatile ferroelectric memory device according to the present invention will be described below.

FIGS. 4a to 4g are layouts and sectional views illustrating the ferroelectric memory according to the present invention.

The nonvolatile ferroelectric memory of the present invention comprises a semiconductor substrate 40 including an active region defined by a device isolation layer 41, cell transistors including gate and source/drain regions in the active region of the semiconductor substrate 40, a capacitor first electrode 47b contacted with one region of the source/drain regions, a ferroelectric layer 48 including a resistor region 49 at one side on the capacitor first electrode 47b, a capacitor second electrode 50 formed on the ferroelectric layer 48, and a bitline 51 contacted with the other region of the source/drain regions of the cell transistors.

The process steps of the ferroelectric memory having the aforementioned sectional structure, according to the present invention, will be described below.

Figures 1, 4A:
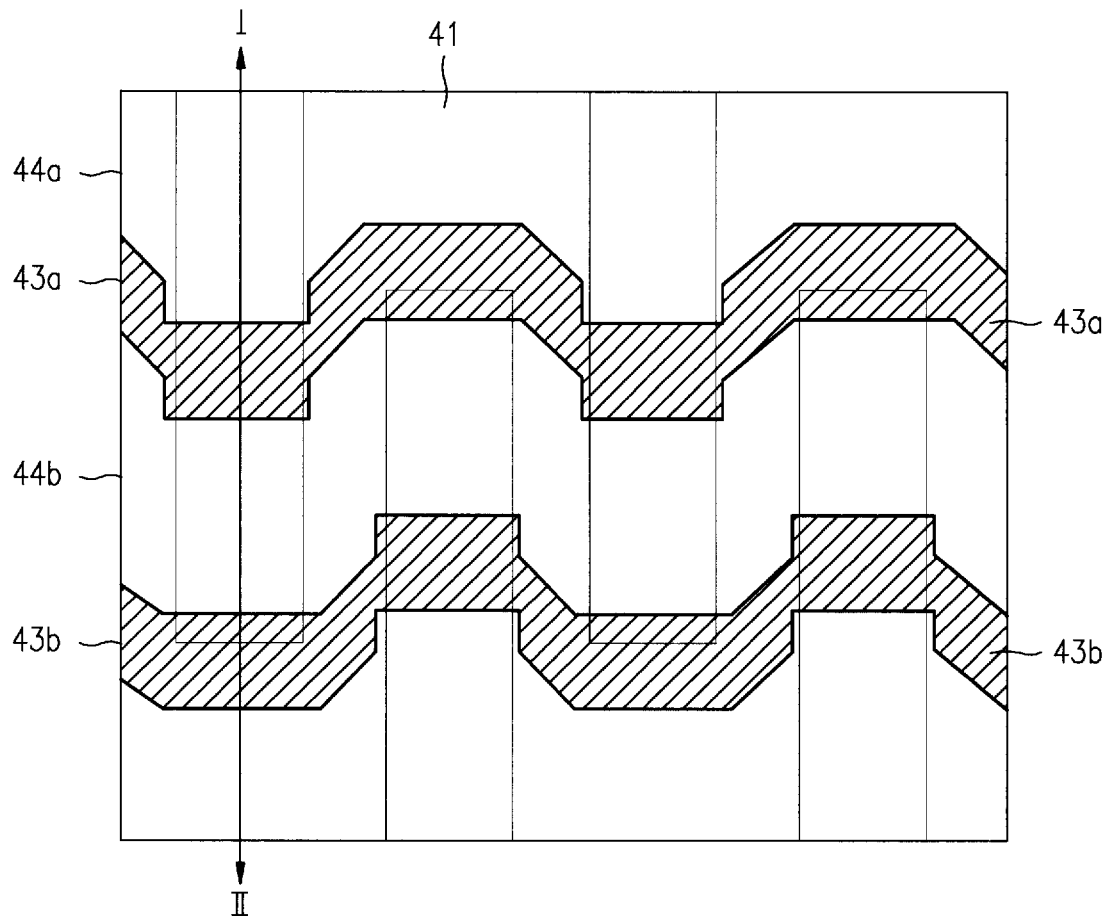
FIGS. 4a to 4g are layouts and sectional views illustrating a ferroelectric memory according to the present invention.
Figures 2, 4A:
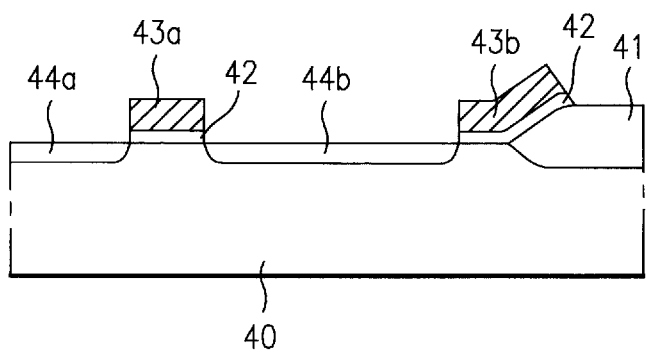

As shown in FIG. 4a, a device isolation layer 41 is formed in a device isolation region of a semiconductor substrate 40 by field oxidation process. A gate oxide layer 42, i.e., a polysilicon layer for the formation of gate is formed on an entire surface of the semiconductor substrate 40 and then selectively patterned to form first and second wordlines 43a and 43b.

Subsequently, impurity ions are implanted into the active region using the first and second wordlines 43a and 43b as masks to form source/drain regions 44a and 44b.

Figures 1, 4B:
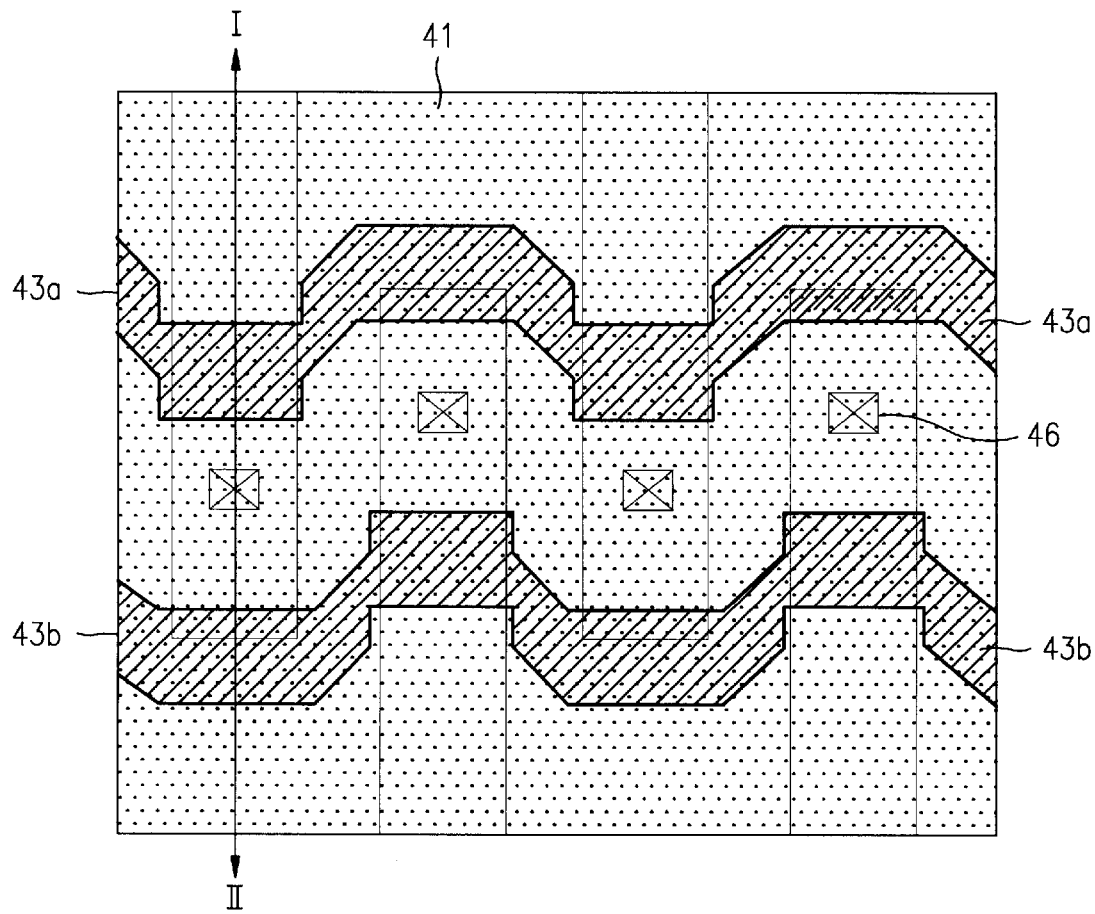
Figures 2, 4B:
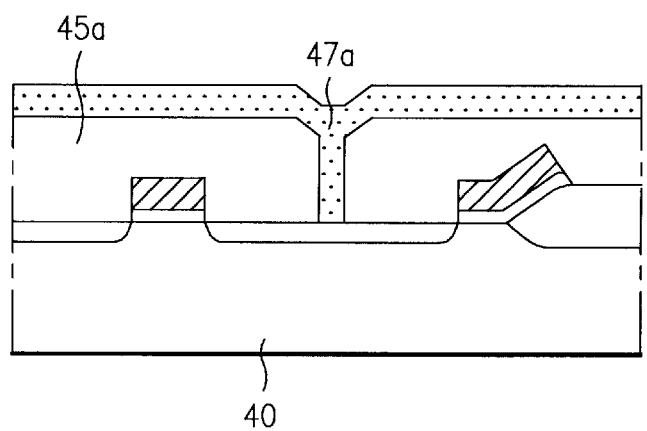

As shown in FIG. 4b, a first interlevel insulating layer 45a is formed on the entire surface of the semiconductor substrate 40 and then patterned to expose any one region of the source/drain regions 44a and 44b, so that a storage node contact hole 46 is formed.

Subsequently, a capacitor first electrode material layer 47a is formed on the entire surface including the storage node contact hole 46.

Figures 1, 4C:
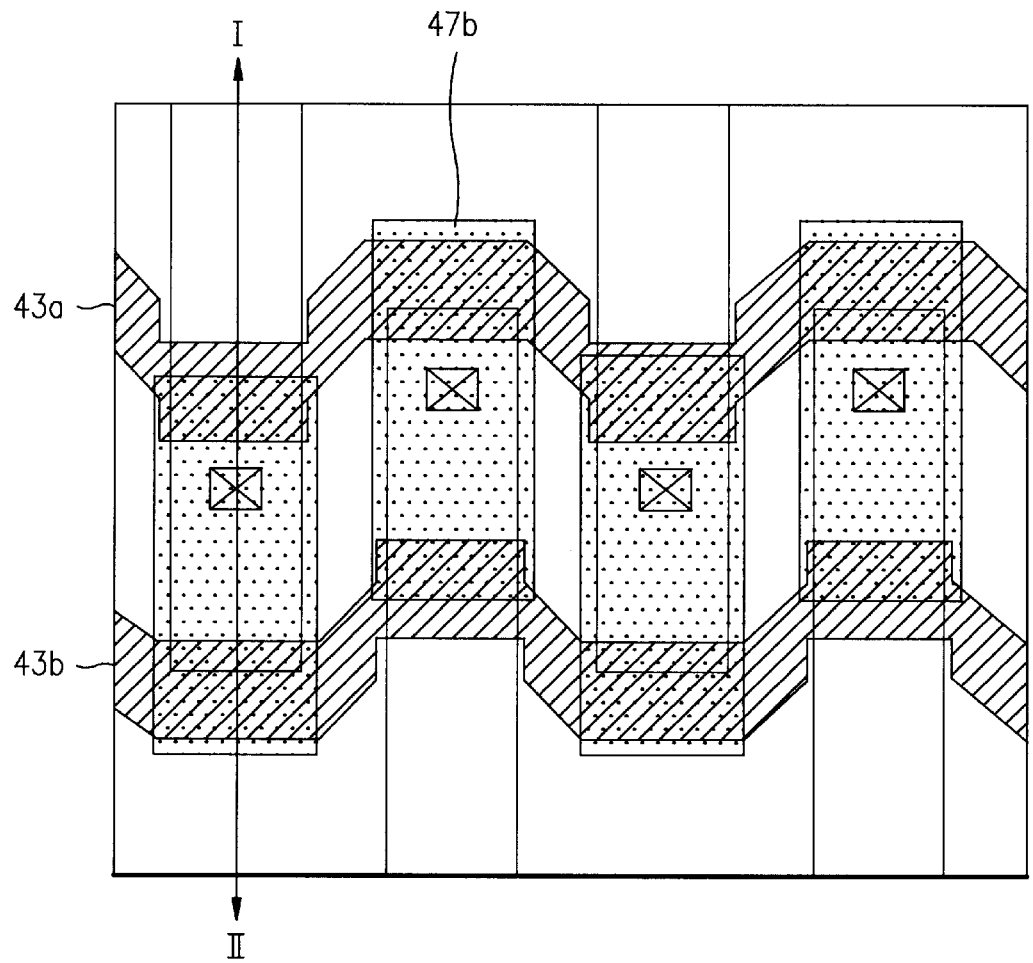
Figures 2, 4C:
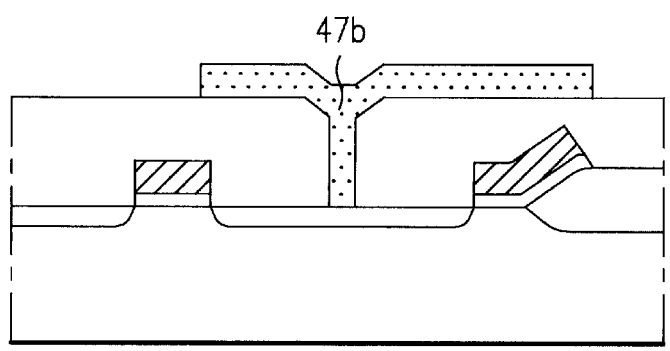

As shown in FIG. 4c, the capacitor first electrode material layer 47a is selectively patterned to form a capacitor first electrode 47b.

Figures 1, 4D:
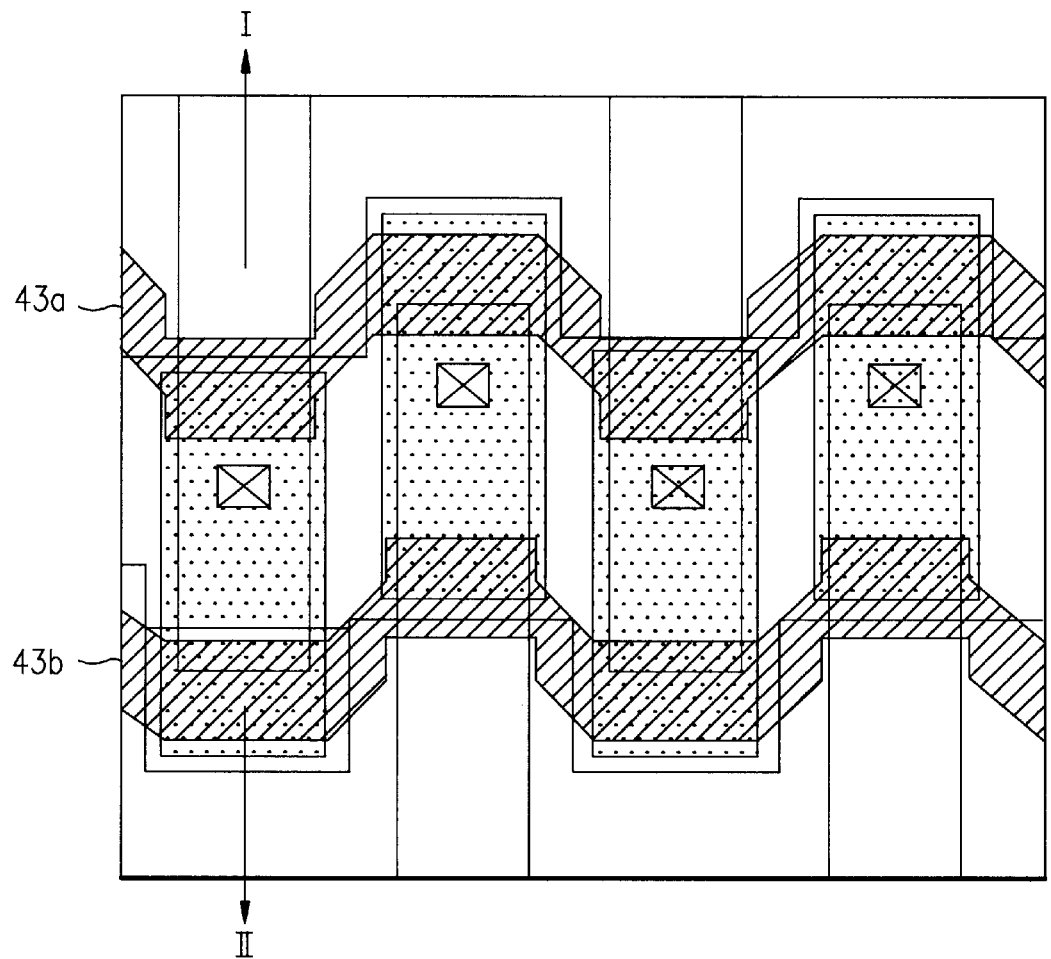
Figures 2, 4D:
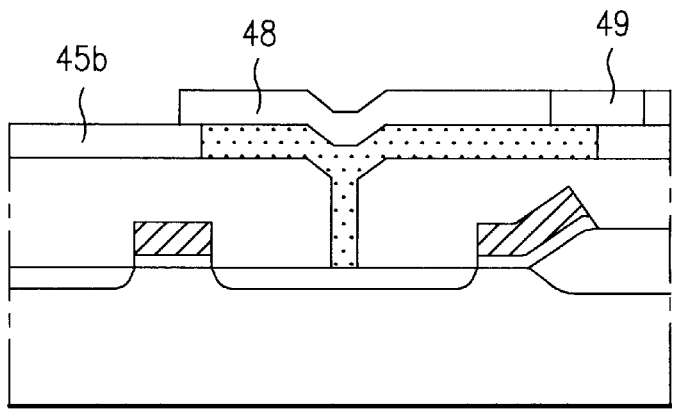

As shown in FIG. 4d, a second interlevel insulating layer 45b is formed on the entire surface including the capacitor first electrode 47b and then flattened. A ferroelectric material layer is deposited on the entire surface and selectively patterned to form a ferroelectric layer 48.

A photoresist layer (not shown) is formed on the entire surface including the ferroelectric layer 48 and patterned to expose some of the ferroelectric layer 48. Then, Impurity ions are selectively implanted into the entire surface using the patterned photoresist layer as a mask to form a resistor region 49.

Figures 1, 4E:
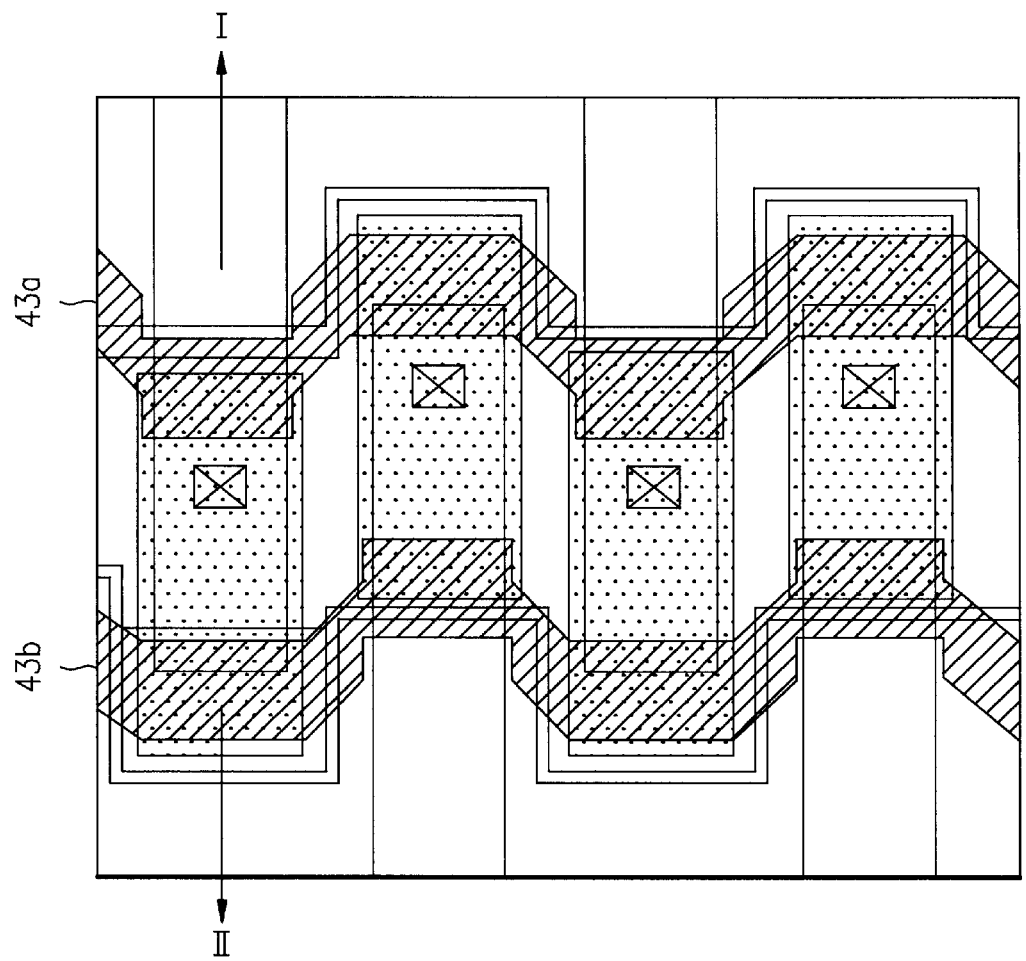
Figures 2, 4E:
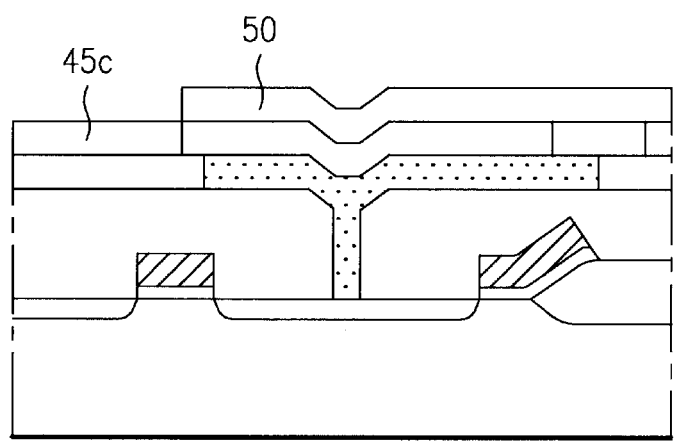

As shown in FIG. 4e, a third interlevel insulating layer 45c is formed on the entire surface including the ferroelectric layer 48 having the resistor region 49 and flattened. A capacitor second electrode material layer is then formed on the entire surface and selectively patterned to form a capacitor second electrode 50.

Figures 1, 4F:
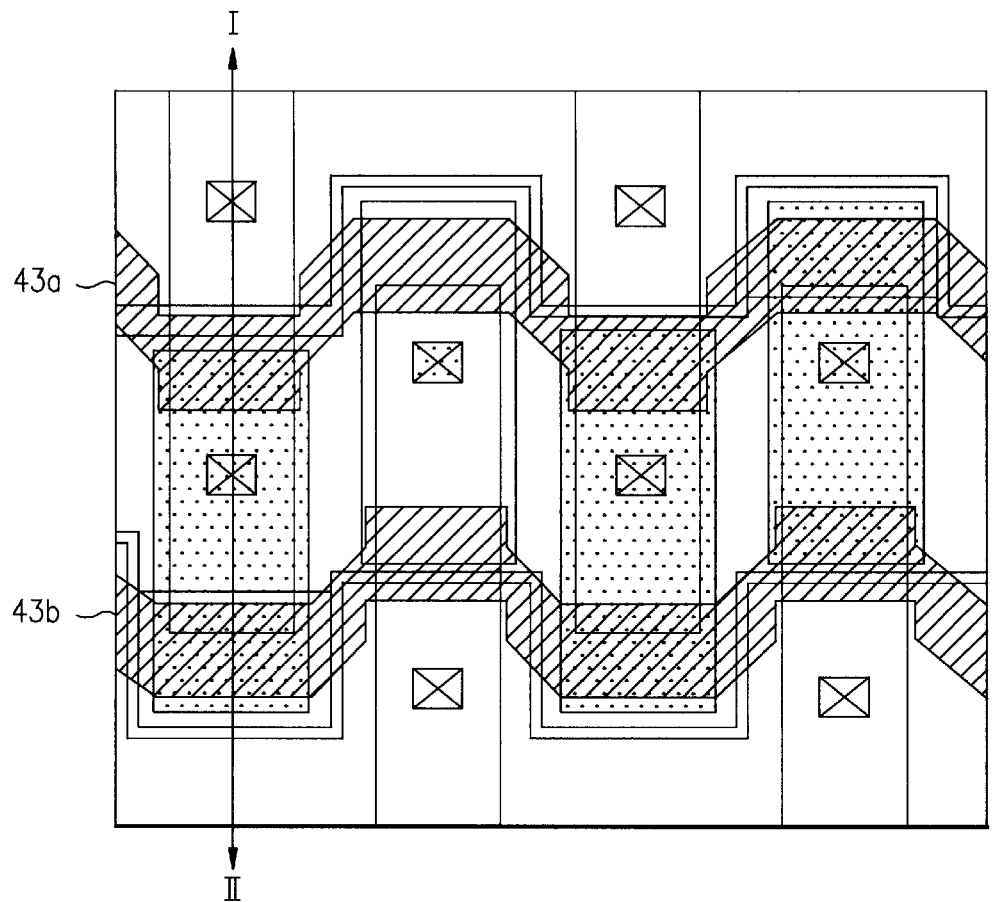
Figures 2, 4F:
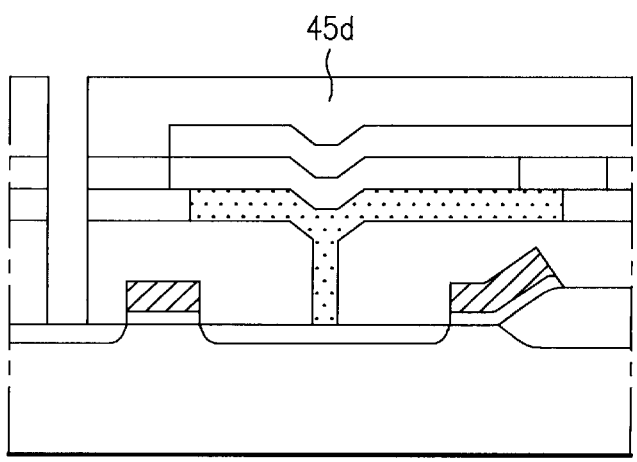

Subsequently, as shown in FIG. 4f, a fourth interlevel insulating layer 45d is formed on the entire surface including the capacitor second electrode 50 and selectively patterned to expose the other region of the source/drain regions 44a and 44b, so that a bitline contact hole is formed.

Figures 1, 4G:
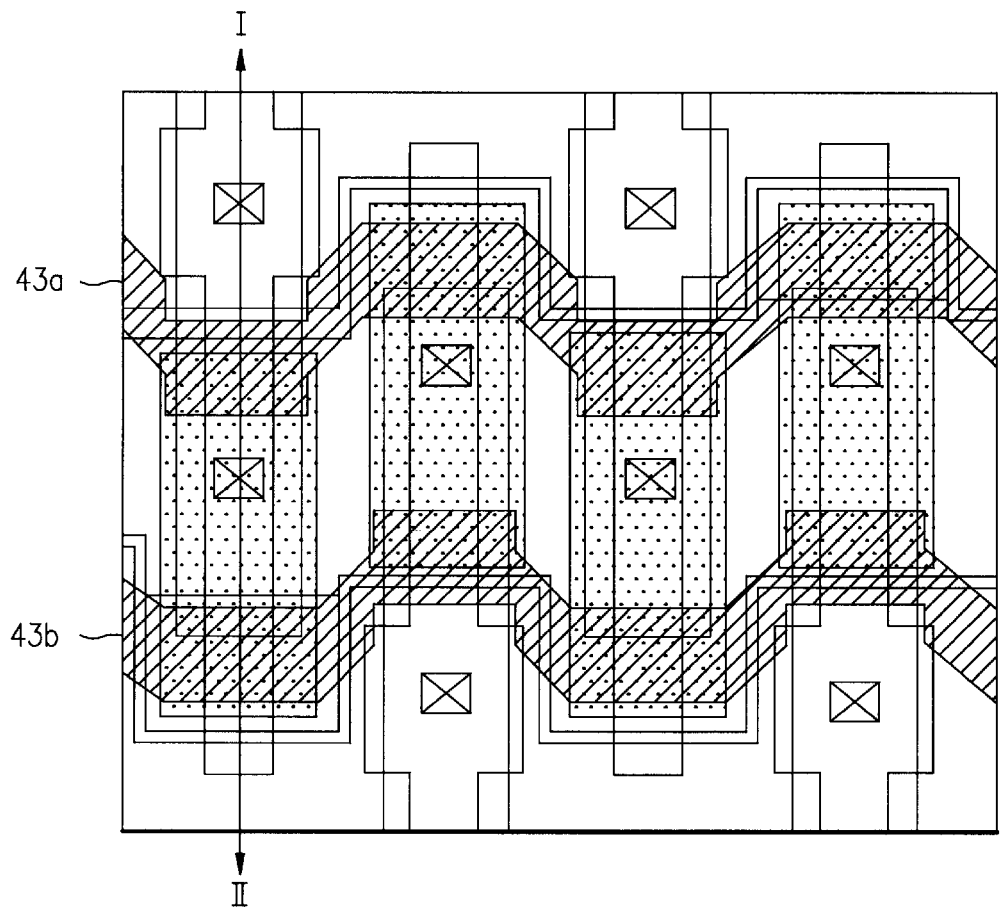
Figures 2, 4G:
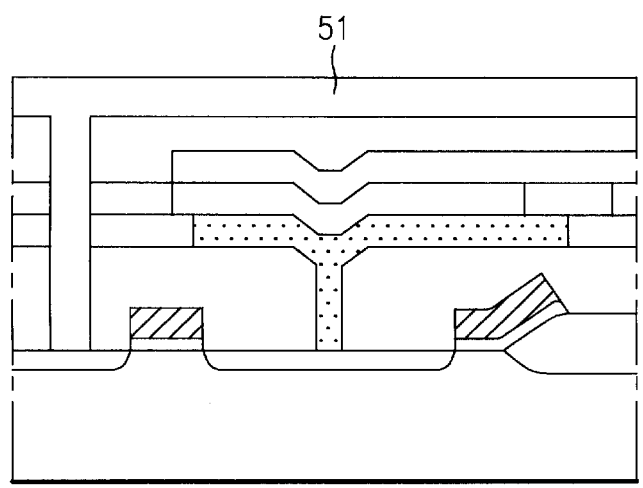

As shown in FIG. 4g, a bitline material layer is formed on the entire surface including the bitline contact hole and selectively patterned to form a bitline 51.

Now, instead of forming the resistor region 49 having high resist at some of the ferroelectric layer 48, the other embodiment of the present invention will be described below, in which a separate polysilicon layer, that is, a high resistor layer is formed between the ferroelectric layer 48 and the capacitor second electrode 50 to which Vcc/2 voltage is applied, to be connected with them.

Figure 5:
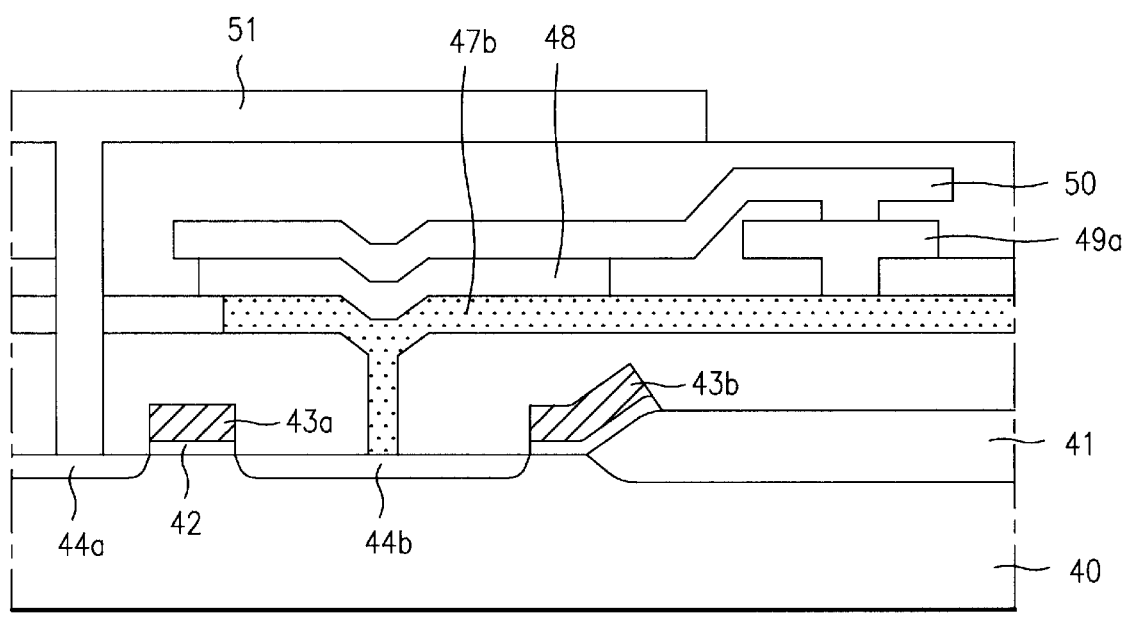
FIG. 5 is a sectional view illustrating a ferroelectric memory according to the other embodiment of the present invention.
Figure 6A:
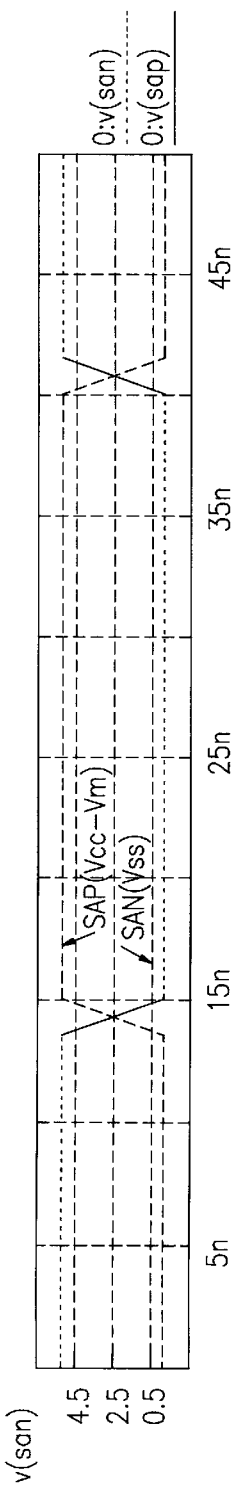
FIG. 6 are waveforms illustrating the operation of a ferroelectric memory according to the present invention.
Figure 6B:
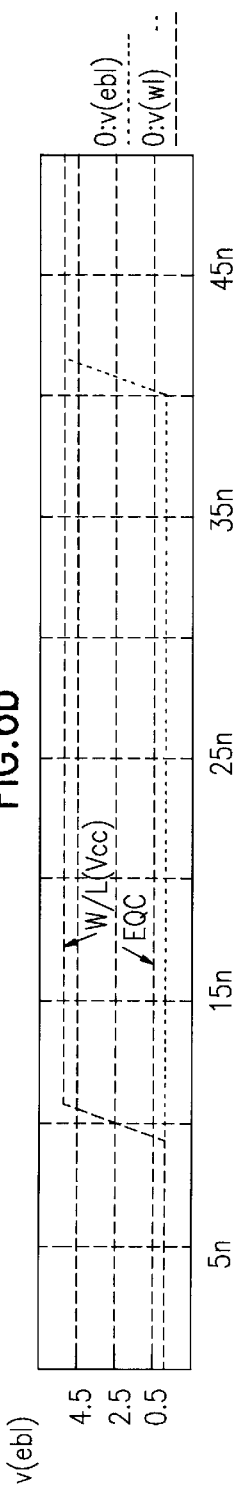
Figure 6C:
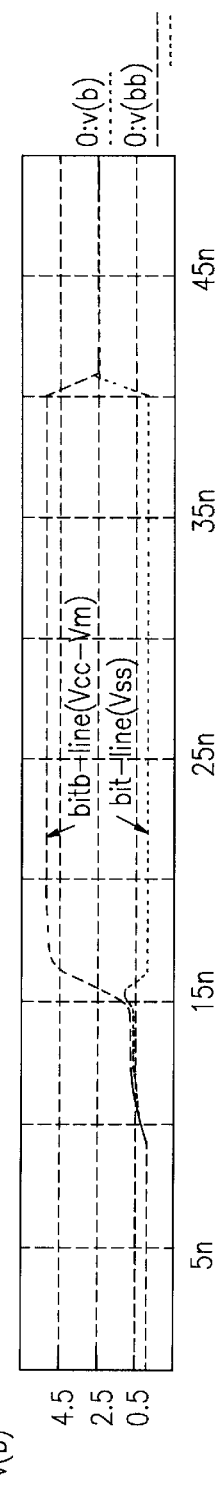
Figure 6D:
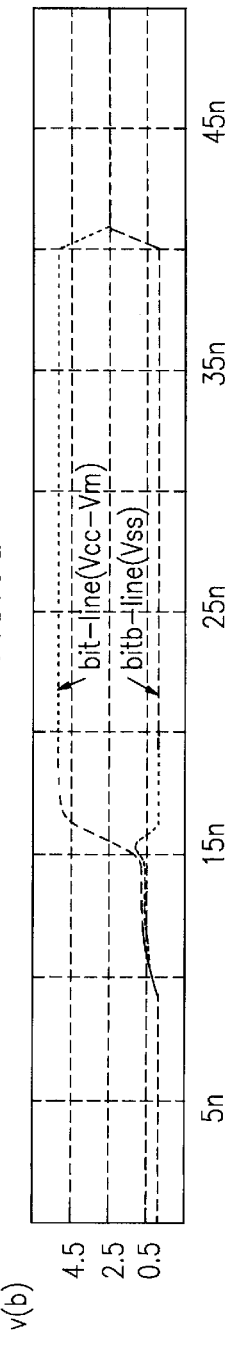

FIG. 5 is a sectional view illustrating a ferroelectric memory according to the other embodiment of the present invention.

As shown in FIG. 5, the nonvolatile ferroelectric memory according to the other embodiment of the present invention comprises a semiconductor substrate 40 including an active region defined by a device isolation layer 41, cell transistors including gate and source/drain regions in the active region of the semiconductor substrate 40, a capacitor first electrode 47b contacted with one region of the source/drain regions, a ferroelectric layer 48 formed on the capacitor first electrode 47b, a capacitor second electrode 50 formed on the ferroelectric layer 48, a high resistor layer 49a separated from the ferroelectric layer 48 and formed between the capacitor first electrode 47b and the capacitor second electrode 50, and a bitline 51 contacted with the other region of the source/drain regions of the cell transistors.

Data sensing operation of the nonvolatile ferroelectric memory according to the present invention will be described below.

FIG. 6 are waveforms of the ferroelectric memory according to the present invention.

In the nonvolatile ferroelectric memory of the present invention, the wordlines of the main memory cell block 31 and the reference memory cell block 32 are under the same control signal.

The pull-down control signal PDC pulls down the bitline and the bit bar line at Vss level. The pull-up control signal EQC pulls up the bit line and the bit bar line at Vcc/2 and equalizes them.

The sensing amplifier PMOS enable signal SAP and the sensing amplifier NMOS enable signal SAN which operate the sensing amplifier become low and high, respectively, during disable mode, while become high and low, respectively, during enable mode.

During reading mode, the pull-up control signal EQC is applied at low pulse and the pull-down control signal PDC is applied at high pulse, so that the bitline and the bit bar line become low potential. In this state, if high pulse is applied to the wordline to enable the wordline, the data of the main cell are transmitted to the bit line and the data of the reference cell are transmitted to the bit bar line.

In other words, in case of writing '0' in the main cell, the bitline and the bit bar line have Vss level, and after enabling the wordline in reading mode, the bitline level becomes slowly lower than the bit bar line level.

On the other hand, in case of writing '1' in the main cell, the bitline level is slowly higher than the bit bar line in a curved line of reading mode.

If sufficient data are loaded in the bitline and the bit bar line, the sensing amplifier is operated to output signals.

During disable mode, the SAP signal and the SAN signal become low and high, respectively, while, during enable mode, they become high and low, respectively.

At this time, the SAP signal level becomes Vcc-Vm so as not to damage the data of the reference cell after amplifying the sensing amplifier. Where, Vm is 1.0~2.0V level and is determined by threshold voltage capable of causing polarity variation of the ferroelectric material. The cell plate node is maintained at Vcc/2 level.

After amplifying the sensing amplifier, the sensing amplifier is disabled prior to disabling the wordline and the bitline and the bit bar line become Vcc/2 level. This is to fix the inner nodes n1, n2, R1 and R2 of the cell at Vcc/2.

In other words, the voltage at both ends of the capacitor becomes 0V due to Vcc/2 applied to the bitline and the bit bar line, and the nodes n1, n2, Rn1 and Rn2 are continuously maintained at Vcc/2 level by means of current supply of the resistor devices.

The bitline level which will be input to the main cell in writing mode is full Vcc or Vss. The polarity of the ferroelectric material used as the capacitor dielectric is varied due to the voltage difference between the bitline level and Vcc/2 level of the cell plate.

In the same manner as the reading mode, after writing, the bitline and the bit bar line become Vcc/2 prior to disabling the wordline. This is to fix the inner nodes n1, n2, R2 and R2 of the cell at Vcc/2.

If the Vcc level signal is applied to the bitline, a signal having level '1' is written. If the Vss level signal is applied to the bitline, a signal having level '0' is written. A signal having level '0' is always written in the reference cell.

Therefore, during writing mode, the bitline level becomes full Vcc level, and during reading mode, the bitline and the bit bar line become Vcc-Vm level.

In the aforementioned operation, the resistor device between both ends of the capacitor has the resistor value determined to satisfy that junction leakage current of the NMOS transistor can be supplemented and the voltage difference between both ends of the capacitor during disabling the wordline does not exceed 1V. During reading mode, prior to enabling the wordline, the resistor device value must be determined to allow the nodes n1, n2, R1 and R2 in the main cell and the reference cell to have the same level.

The capacitance in the reference cell is determined 1.5~3 times greater than the capacitance value of the main memory cell.

The aforementioned nonvolatile ferroelectric memory of the present has the following advantages.

Since a separate circuit for compensating a voltage of a node within the memory cell and a voltage compensating cycle are not required, memory cell access of non driven cell plate line method is possible, thereby simplifying the circuit structure and enabling fast access time.

It will be apparent to those skilled in the art that various modifications and variations can be made in the nonvolatile ferroelectric memory according to the present invention without departing from the spirit or scope of the invention. Thus, it is intended that the present invention covers the modifications and variations of the invention provided they come within the scope of the appended claims and their equivalents.

What is claimed is:

1. A nonvolatile ferroelectric memory comprising:
   main memory cell blocks including first and second wordlines WL1 and WL2, a first cell transistor MN1 whose gate is connected to the first wordline WL1 and one electrode is connected to a bitline Bit_line, a second transistor MN2 whose gate is connected to the second wordline WL2 and one electrode is connected to a bit bar line BitB_line, a first ferroelectric capacitor FC1 whose first electrode is connected to the other electrode of the first transistor MN1 and second electrode is connected to a Vcc/2 voltage applying line hvcc, a first resistor device RM1 formed between a first node n1 for connecting the other electrode of the first transistor MN1 with the first electrode of the first ferroelectric capacitor FC1 and the Vcc/2 voltage applying line hvcc, a second ferroelectric capacitor FC2 whose first electrode is connected to the other electrode of the second transistor MN2 and second electrode is connected to the Vcc/2 voltage applying line hvcc, and a second resistor device RM2 formed between a second node n2 for connecting the other electrode of the second transistor MN2 with the first electrode of the second ferroelectric capacitor FC2 and the Vcc/2 voltage applying line hvcc; and
   reference cell blocks formed to correspond to the main memory cell blocks, for reading out data of the memory cell blocks.

2. The nonvolatile ferroelectric memory as claimed in claim 1, wherein each of the reference cell blocks includes:
   first and second wordlines WL1 and WL2;
   a first reference transistor RN1 whose gate is connected to the second wordline WL2 and one electrode is connected to the bitline Bit_line;
   a first reference ferroelectric capacitor RFC1 whose first electrode is connected to the other electrode of the first reference transistor RN1 and second electrode is connected to the Vcc/2 voltage applying line hvcc;
   a first resistor device RR1 formed between a first node Rn1 for connecting the other electrode of the first reference transistor RN1 with the first electrode of the first reference ferroelectric capacitor RFC1 and the Vcc/2 voltage applying line hvcc;
   a second reference transistor RN2 whose gate is connected to the second wordline WL2 and one electrode is connected to the bit bar line BitB_line;
   a second reference ferroelectric capacitor RFC2 whose first electrode is connected to the other electrode of the second reference transistor RN2 and second electrode is connected to the Vcc/2 voltage applying line hvcc; and
   a second resistor device RR2 formed between a second node Rn2 for connecting the other electrode of the second reference transistor RN2 with the first electrode of the first reference ferroelectric capacitor RFC1 and the Vcc/2 voltage applying line hvcc.

3. The nonvolatile ferroelectric memory as claimed in claim 1, wherein data of the main cell are transmitted to the bitline and data of the reference cell are transmitted to the bit bar line if high pulse is applied to the wordlines to enable the wordline, and in case of writing '0' in the main cell, the bitline and the bit bar line have Vss level after enabling the wordlines in reading mode, and then the bitline level becomes slowly lower than the bit bar line level.

4. The nonvolatile ferroelectric memory as claimed in claim 1, wherein in case of writing '1' in the main cell, the bitline level is slowly higher than the bit bar line during reading mode.

5. The nonvolatile ferroelectric memory as claimed in claim 1, wherein the capacitance in the reference cell is 1.5~3 times greater than the capacitance value of the main memory cell.

6. The nonvolatile ferroelectric memory as claimed in claim 1, to read out data of the main memory cell blocks using the reference cell blocks, further comprising a sensing amplifier/bitline control block including a bitline control block and a sensing amplifier block, wherein the bitline control block includes first and second NMOS transistors N1 and N2 whose gates are in common connected to a pull-down control signal input terminal PDC, one electrodes are connected to the bitline and the bit bar line, respectively, and the other electrodes are connected to a ground terminal Vss, and third, fourth and fifth NMOS transistors N3, N4 and N5 whose gates are in common connected to a pull-up control signal input terminal EQC; and the sensing amplifier block includes first and second PMOS transistors P1 and P2 whose one electrodes are in common connected to a sensing amplifier PMOS enable signal input terminal SAP, and sixth and seventh NMOS transistors N6 and N7 whose one electrodes are in common connected to a sensing amplifier NMOS enable signal input terminal SAN.

7. The nonvolatile ferroelectric memory as claimed in claim 6, wherein source and drain of the fifth NMOS transistor N5 are connected to the bitline and the bit bar line, respectively, and one electrodes of the third and fourth transistors N3 and N4 are in common connected to a precharge signal input terminal Vcc/2 and the other electrodes thereof are connected to the bitline and the bit bar line, respectively.

8. The nonvolatile ferroelectric memory as claimed in claim 6, wherein gates of the first PMOS transistor P1 and the sixth NMOS transistor N6 and the other electrodes of the second PMOS transistor P2 and the seventh NMOS transistor N7 are in common connected to the bit bar line, and gates of the second PMOS transistor P2 and the seventh NMOS transistor N7 and the other electrodes of the first PMOS transistor P1 and the sixth NMOS transistor N6 are in common connected to the bit line.

9. The nonvolatile ferroelectric memory as claimed in claim 6, wherein the pull-down control signal PDC pulls down the bitline and the bit bar line at Vss level, and the pull-up control signal EQC pulls up the bit line and the bit bar line at Vcc/2 level to equalize them.

10. The nonvolatile ferroelectric memory as claimed in claim 6, wherein, during reading mode, the pull-up control signal EQC is applied at low pulse and the pull-down control signal PDC is applied at high pulse, so that the bitline and the bit bar line become low potential.

11. The nonvolatile ferroelectric memory as claimed in claim 6, wherein, during enabling the sensing amplifier block, the SAP signal becomes Vcc−Vm, where Vm is 1.0~2.0V level and is determined by threshold voltage capable of causing polarity variation of a ferroelectric material.

12. The nonvolatile ferroelectric memory as claimed in claim 6, wherein the bitline becomes full Vcc level during writing mode, and the bitline and the bit bar line become Vcc−Vm level during reading mode.

13. A nonvolatile ferroelectric memory comprising:
a semiconductor substrate including an active region defined by a device isolation layer;
a transistor including gate and source/drain regions in the active region of the semiconductor substrate;
a ferroelectric capacitor having first and second electrodes and a ferroelectric layer formed between the first and second electrodes, the first electrode being coupled to one of the source/drain regions;
a resistor coupled in parallel with the ferroelectric capacitor; and
a bitline being coupled with the other region of the source/drain regions of the transistor.

14. The nonvolatile ferroelectric memory of claim 13, wherein the resistor comprises a resistor region formed by an ion implanted ferroelectric layer and formed between the first and second electrodes of the ferroelectric capacitor.

15. The nonvolatile ferroelectric memory of claim 14, wherein the resistor region is formed adjacent to the ferroelectric layer such that the ferroelectric layer and the resistor region are planar.

16. The nonvolatile ferroelectric memory of claim 13, the resistor comprises a high resistor polysilicon layer separated from the ferroelectric layer and formed between the first electrode and the second electrode of the ferroelectric capacitor.

17. The nonvolatile ferroelectric memory of claim 16, wherein the high resistor polysilicon layer is formed adjacent to the ferroelectric layer.

18. The nonvolatile ferroelectric memory of claim 16, wherein the high resistor polysilicon layer has a T-type shape.

19. A nonvolatile memory, comprising:
a first memory cell array having a plurality of first word lines formed in a first direction, a plurality of bit lines in a second direction, a first common signal line; and a plurality of first memory cells, each first memory cell being coupled to a corresponding first word line, a corresponding bit line, and the first common signal line; and
a controller coupled to the plurality of bit lines, said controller allowing at least one of reading of data stored in a corresponding first memory cell and writing of data to a corresponding first memory cell, wherein each first memory cell of the first memory cell array includes:
a first transistor having first and second electrodes and a control electrode, the control electrode being coupled to the corresponding first word line, the first electrode being coupled to the corresponding bit line,
a first capacitor coupled to the second electrode of the first transistor and the first common signal line, and
a first resistor coupled in parallel with the first capacitor.

20. The nonvolatile memory of claim 19, wherein said first capacitor is a ferroelectric capacitor having first and second capacitor electrodes and a ferroelectric layer formed between the first and second capacitor electrodes.

21. The nonvolatile memory of claim 20, wherein the first resistor comprises a resistor region formed by an ion implanted ferroelectric layer.

22. The nonvolatile memory of claim 21, wherein the resistor region is formed between the first and second capacitor electrodes and the ferroelectric layer and the resistor region are planar.

23. The nonvolatile memory of claim 20, wherein the first resistor comprises a high resistor polysilicon layer separated from the ferroelectric layer.

24. The nonvolatile memory of claim 23, wherein the high resistor polysilicon layer is formed adjacent to the ferroelectric layer and between the first and second capacitor electrodes.

25. The nonvolatile memory of claim 24, wherein the high resistor polysilicon layer has a T-type shape.

26. The nonvolatile memory of claim 19, further comprising:
- a second memory cell array having a plurality of second word lines formed in the first direction, the plurality of bit lines in the second direction coupled to the controller, a second common signal line, and a plurality of second memory cells, each second memory cell being coupled to a corresponding second word line, a corresponding bit line, and the second common signal line, wherein each second memory cell of the second memory cell array includes:
    - a second transistor having first and second electrodes and a control electrode, the control electrode being coupled to the corresponding second word line, the first electrode being coupled to the corresponding bit line,
    - a second capacitor coupled to the second electrode of the second transistor and the second common signal line, and
    - a second resistor coupled in parallel with the second capacitor.

27. The nonvolatile memory of claim 26, wherein said second capacitor is a ferroelectric capacitor having first and second capacitor electrodes and a ferroelectric layer formed between the first and second capacitor electrodes.

28. The nonvolatile memory of claim 26, wherein the first and second common signal lines are separate signal lines formed in the first direction.

29. The nonvolatile memory of claim 28, wherein the first and second common signal lines are coupled for receiving a prescribed voltage.

30. The nonvolatile memory of claim 19, wherein the controller comprises:
- a bitline control circuit coupled to the plurality of bit lines, the bitline control circuit controlling application of a potential on the plurality of bit lines; and
- a sense amplifier coupled to the plurality of bit lines, the sense amplifier sensing a potential difference between a pair of bit lines.

31. The nonvolatile memory of claim 30, wherein the sense amplifier comprises first, second, third and fourth sensing transistors, each having first and second electrodes and a control electrode, the first electrode of first and second sensing transistors being coupled for receiving a first control signal, the second electrode of the first sensing transistor being coupled to the first electrode of the third sensing transistor and the second electrode of the second sensing transistor being coupled to the first electrode of the fourth sensing transistor, the second electrode of the second and fourth sensing transistors being coupled for receiving a second control signal, and the control electrode of the second and fourth sensing transistors being coupled to one of the pair of bit lines and the control electrode of the first and third transistors being coupled to the other one of the pair of bit lines.

32. The nonvolatile memory of claim 30, wherein said bitline control circuit comprises:
- a pull-down circuit that pulls down the pair of bit lines to a first prescribed potential in response to a first control signal; and
- a pull-up circuit that pulls up the pair of bit lines to a second prescribed potential in response to a second control signal.

33. The nonvolatile memory of claim 32, wherein the pull-down circuit comprises:
- a first pull-down transistor having first and second electrodes and a control electrode, the control electrode being coupled for receiving the first control signal, the first electrode coupled to one of the pair of bit lines and the second electrode coupled for receiving the first prescribed potential; and
- a second pull-down transistor having first and second electrodes and a control electrode, the control electrode being coupled for receiving the first control signal, the first electrode coupled to the other one of the pair of bit lines and the second electrode coupled for receiving the first prescribed potential.

34. The nonvolatile memory of claim 32, wherein the pull-up circuit comprises:
- first, second and third pull-up transistors, each having first and second electrodes and a control electrode, the control electrode of the first, second and third pull-up transistors being coupled for receiving the second control signal, the first electrode of the first and third pull-up transistors being coupled to one of the pair of bit lines, the first electrode of the second pull-up transistor and the second electrode of the third pull-up transistor being coupled to the other one of the pair of bit lines, and the second electrode of the first and second pull-up transistors being coupled for receiving the second prescribed potential.

* * * * *